(12) United States Patent
Doyle et al.

(10) Patent No.: US 10,784,136 B2
(45) Date of Patent: Sep. 22, 2020

(54) FOUP PURGE SHIELD

(71) Applicant: ONTO INNOVATION INC., Wilmington, MA (US)

(72) Inventors: Paul A. Doyle, Milpitas, CA (US); Morgan A. Crouch, Santa Clara, CA (US)

(73) Assignee: ONTO INNOVATION INC., Wilmington, MA (US)

( * ) Notice: Subject to any disclaimer, the term of this patent is extended or adjusted under 35 U.S.C. 154(b) by 0 days.

(21) Appl. No.: 16/048,200

(22) Filed: Jul. 27, 2018

(65) Prior Publication Data

US 2020/0035531 A1 Jan. 30, 2020

(51) Int. Cl.
| H01L 21/67 | (2006.01) |
| H01L 21/673 | (2006.01) |
| B08B 5/00 | (2006.01) |

(52) U.S. Cl.
CPC .......... H01L 21/67393 (2013.01); B08B 5/00 (2013.01); H01L 21/67017 (2013.01); H01L 21/67126 (2013.01)

(58) Field of Classification Search
CPC .............. H01L 21/67017; H01L 21/67772
See application file for complete search history.

(56) References Cited

U.S. PATENT DOCUMENTS

| 6,867,153 B2 | 3/2005 | Tokunaga |
| 7,100,340 B2 | 9/2006 | Bonora et al. |
| 8,413,814 B2 | 4/2013 | Ku et al. |
| 2002/0069933 A1 | 6/2002 | Otaguro |
| 2005/0111943 A1 | 5/2005 | Otaguro |
| 2006/0045663 A1 | 3/2006 | Aggarwal et al. |
| 2008/0156679 A1* | 7/2008 | Bonora .............. B65D 81/2076 206/320 |
| 2015/0002467 A1 | 1/2015 | Tempas et al. |
| 2017/0025296 A1 | 1/2017 | Emoto et al. |

FOREIGN PATENT DOCUMENTS

WO 2009/009780 A2 1/2009

OTHER PUBLICATIONS

Interntational Search Report and Written Opinion dated Aug. 22, 2019 for PCT Application No. PCT/US2019/036348 filed Jun. 10, 2019.

* cited by examiner

*Primary Examiner* — Saul Rodriguez
*Assistant Examiner* — Willie Berry, Jr.
(74) *Attorney, Agent, or Firm* — Paradice and Li LLP

(57) ABSTRACT

A load port for loading wafers to and unloading wafers from a front opening unified pod (FOUP) includes a shield member that covers and provides a seal over an opening of the FOUP. The shield member includes a narrow wafer slot that is sized to allow a single wafer to be loaded to or unloaded from the FOUP but otherwise minimize loss of the purge environment within the FOUP. The shield member is movable so that the wafer slot may be moved vertically to provide a wafer transfer robot access to any desired wafer position within the FOUP. The shield member, for example, may be a flexible sheet that is held taut and is rolled onto and off of at least one roller to vertically position the wafer slot. The shield member may alternatively be one or more rigid members that slide on rails to vertically position the wafer slot.

19 Claims, 8 Drawing Sheets

FOUP PURGE SHIELD

FIELD OF THE INVENTION

The present invention is related to generally to the field of semiconductor processing equipment, and in particular to controlling the purge environment in a semiconductor substrate storage and transfer mechanism, such as a front opening unified pod (FOUP).

BACKGROUND

In the semiconductor manufacturing industry, it is important to maintain substrates with a high level of cleanliness. For example, materials and processes in semiconductor manufacturing are vulnerable to Airborne Molecular Contamination (AMC) on the order of parts-per-trillion (PPT), and moisture on the order of parts-per-billion (PPB). Substrates, such as semiconductor wafers and flat panels (collectively sometimes referred to herein as substrates or wafers), are vulnerable to AMC and moisture in the environment, which may produce contaminants on the surface of a substrate or form film growth or corrosion/oxidation. In order to maintain the desired cleanliness, including particle control, chemical cleanliness, and humidity control, substrates are stored and transported in sealable containers referred to as front opening unified pods (FOUPs). To achieve the desired level of cleanliness within a FOUP, an inert purge gas is typically used to protect the wafer.

It is, of course, required to load and unload substrates into a FOUP, e.g., during transfer of substrates from a FOUP to a semiconductor processing device or to another transport container, such as another FOUP, a cassette, a shipping box, etc. The transfer process typically occurs at a load port, which may be part of, e.g., an Equipment Front End Module (EFEM) in a semiconductor processing device. Once a FOUP is installed in a load port, the lid of the FOUP is opened allowing a wafer handling robot to access the FOUP to load or unload substrates. Once the FOUP lid is opened, however, purge gas or air contained within the FOUP is diluted by environmental air, thereby reducing the cleanliness within the FOUP. The purge gas may be injected into the FOUP while the lid of the FOUP is opened, but this requires a large amount of purge gas to maintain the desired level of cleanliness, which is expensive and may be hazardous to service personnel. Accordingly, improvements over conventional load ports are desired.

SUMMARY

A load port for loading wafers to and unloading wafers from a front opening unified pod (FOUP) includes a shield member that covers and provides a seal over an opening of the FOUP. The shield member includes a narrow wafer slot that is sized to allow a single wafer to be loaded to or unloaded from the FOUP but otherwise minimize loss of the purge environment within the FOUP. The shield member is movable so that the wafer slot may be moved vertically to provide a wafer transfer robot access to any desired wafer position within the FOUP. The shield member, for example, may be a flexible sheet that is held taut and is rolled onto and off of at least one roller to vertically position the wafer slot. The shield member may alternatively be one or more rigid members that slide on rails to vertically position the wafer slot.

In one implementation, a load port for loading wafers to and unloading wafers from a front opening unified pod (FOUP) includes a table upon which a FOUP is detachably mounted; and a shield member that covers and provides a seal over an opening of the FOUP when the FOUP is mounted on the table, the shield member having a wafer slot that is sized to allow a wafer to be loaded to or unloaded from the FOUP, the shield member being movable to move the wafer slot vertically to provide access to any desired wafer position within the FOUP.

In one implementation, a method of loading or unloading wafers from a front opening unified pod (FOUP) includes sealing an opening of the FOUP that is detachably mounted to a loading port with a shield member that covers the opening of the FOUP, wherein the shield member has a wafer slot that is sized to allow a wafer to be loaded to or unloaded from the FOUP; moving the shield member to a first position to place the wafer slot at a first vertical position relative to the FOUP to provide access to a first wafer position within the FOUP, wherein a first wafer is loaded to or unloaded from the first wafer position within the FOUP through the wafer slot while the wafer slot is at the first vertical position; and moving the shield member to a second position to place the wafer slot at a second vertical position relative to the FOUP to provide access to a second wafer position within the FOUP, wherein the second wafer position is different than the first wafer position, wherein a second wafer is loaded to or unloaded from the second wafer position within the FOUP through the wafer slot while the wafer slot is at the second vertical position.

DETAILED DESCRIPTION

Figure 1:
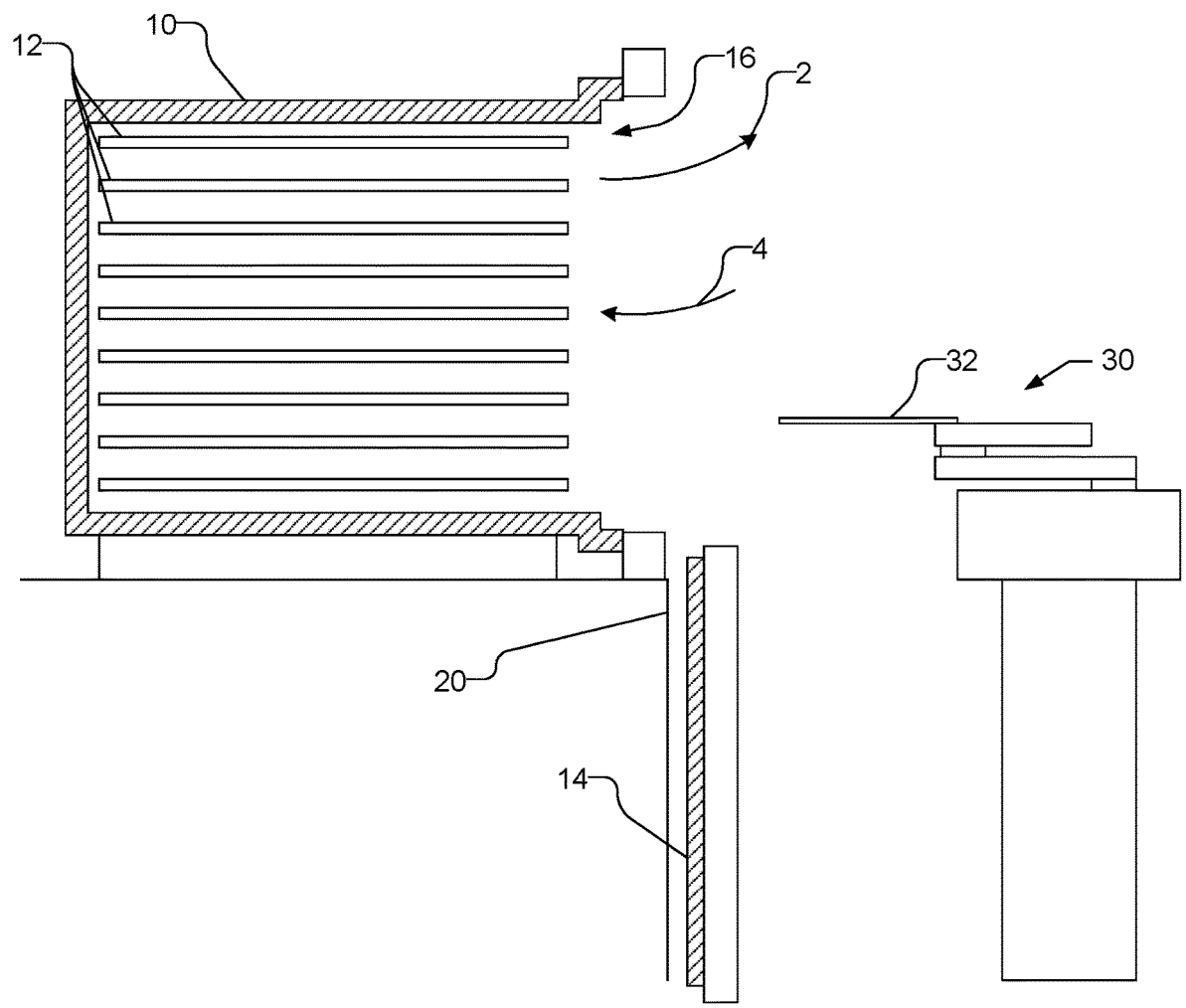
FIG. 1 illustrates a side view of a load port that permits degradation of the purge environment within a FOUP.

FIG. 1 illustrates a side view of a conventional FOUP 10 mounted on a load port 20. The FOUP 10 is illustrated with a plurality of wafers 12 contained within the FOUP 10. The FOUP 10 includes a lid 14, which has been removed so that a wafer handling robot 30 with end-effector 32 can access the FOUP 10 to load or unload wafers. During storage and transport, the lid 14 is placed in the front opening 16 of the FOUP 10 to isolate the wafers 12 within the FOUP 10 from exposure to particles and moisture in the ambient environment. An inert purge gas may be pumped into the FOUP 10 when the lid 14 to the FOUP 10 is sealed in the front opening 16 to provide a clean environment for the wafers. When mounted on the load port 20, the lid 14 of the FOUP 10 is removed, allowing the purge gas to freely escape the interior of the FOUP 10, as illustrated by arrow 2, and the ambient environment to enter the interior of the FOUP 10, as illustrated by arrow 4. Accordingly, with the FOUP 10 is opened, the load port 20 allows the degradation of the purge environment within FOUP 10 thereby allowing the wafers 12 to be exposed to AMC and moisture contamination.

Figure 2:
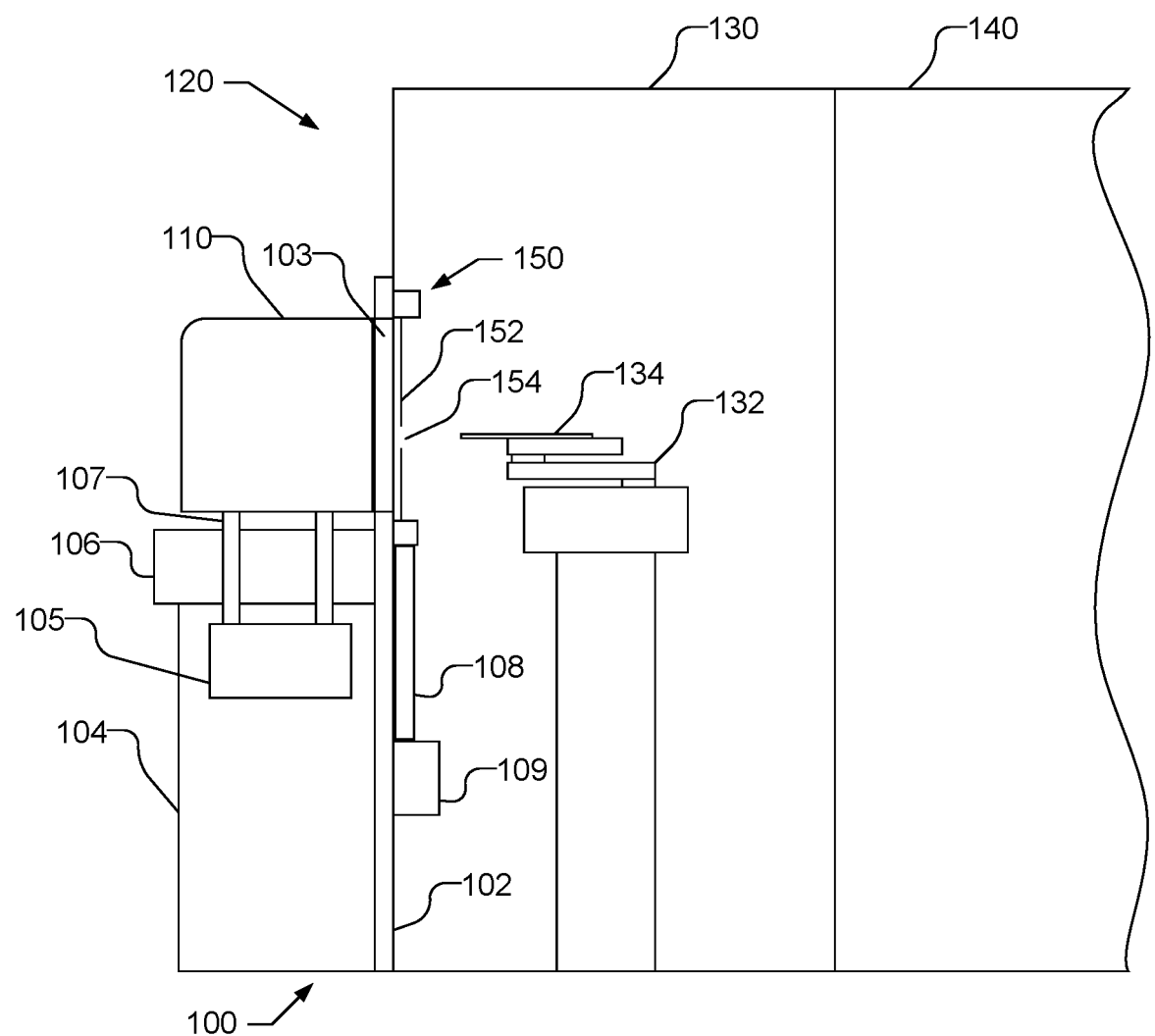
FIG. 2 illustrates a side view of a load port that includes a purge shield to reduce or prevent degradation of the purge environment within a FOUP.

FIG. 2 illustrates a side view of a load port 100 that includes a purge shield 150 to reduce or prevent degradation of the purge environment within a FOUP 110 when the FOUP 110 is opened, e.g., to maintain one or more of the particle control, chemical cleanliness, and humidity control. The load port 100, by way of example, may be part of an EFEM 120 along with a wafer transfer chamber 130. The EFEM 120 is illustrated as being coupled to a semiconductor manufacturing device 140. The semiconductor manufacturing device 140, and the EFEM 120 itself, are illustrated as examples of possible surroundings of the load port 100 and details thereof are omitted as being unnecessary for understanding the load port 100 as disclosed herein.

The load port 100 is used to hold the FOUP 110 and to open and close a lid 112 of the FOUP 110 so that wafers may be loaded into and removed from the FOUP interior by a wafer transfer robot 132, e.g., in the wafer transfer chamber 130. The load port 100 may include a frame 102 that may be used to mount load port 100 to the wafer transfer chamber 130, e.g., when the load port 100 is part of an EFEM 120. The frame 102 includes an opening 103 through which the wafer transfer robot 132 may access the FOUP 110 to load and unload wafers. The load port 100 may further include a table 106, which may be supported by a base 104 or otherwise mounted to the frame 102, and which is configured to permit the FOUP 110 to be detachably mounted. In some implementations, the load port 100 may include one or more purge ports 107, e.g., in the table 106, which is fluidically coupled to the FOUP 110 and configured to provide purge gas or air, e.g., from purge gas supply 105, into the FOUP 110 when the FOUP 110 is mounted on the table 106.

The load port 100 further includes a purge shield 150, which may be mounted to the frame 102 and is positioned over the opening 103. The purge shield 150 includes shield member 152 that provides a seal over the opening of the FOUP 110 when the FOUP 110 is mounted on the table 106. The seal between the shield member 152 and the opening of the FOUP 110 may be created by direct contact between the shield member 152 and the FOUP 110 or may be created by one or more intervening components, such as the frame 102, for example, the shield member 152 and the FOUP 110 may both be in direct contact with opposite sides of the frame 102. Alternatively, the seal between the shield member 152 and the opening 110 of the FOUP 110 may be created, e.g., by the edges of the shield member 152 residing close to the frame 102 with a minimal gap, e.g., less than 3*mm*, to prevent contact and particle generation from contact and movement of the shield member 152, while also minimizing the dilution of the purge gas. Additionally, or alternatively, the edge of the purge shield 150 may be captured in a slot from both sides effectively creating a labyrinth around the edge of the purge shield 150 that is, e.g., less than 3*mm* gap between the slot and purge shield 150. The labyrinth would effectively increase the resistance of the path to atmosphere reducing dilution of the purged volume.

The shield member 152 includes a horizontal wafer slot 154 that is sized to allow a wafer to be loaded to or unloaded from the FOUP 110. The shield member 152 is movable so that the wafer slot 154 may be moved vertically, upward or downward, to provide access to any desired wafer position within the FOUP 110, e.g., the wafer slot 154 may be moved vertically to allow the wafer transfer robot 132 to load or unload a wafer through the shield member 152 at any desired position in the FOUP 110. The wafer slot 154 may be rectangular with a width and a height sufficient to accommodate a single wafer to pass through when being loaded to or unloaded from the FOUP 110. If desired, the wafer slot 154 may include a cut-out portion to accommodate the end-effector 134 of the wafer transfer robot 132. If desired, the wafer slot 154 may not only be moved vertically to provide access at any wafer support position within the FOUP 110 but may also be moved so as to completely seal the opening 103 in the frame 102, i.e., the wafer slot 154 is not positioned in the opening 103 or is otherwise closed.

The load port 100 may include a separate door 108 that may be moved, e.g., along rails (not shown) by a door elevating motor 109 from a closed position in which the opening 103 is sealed to an open position allowing access to the FOUP 110 through the opening 103. When the FOUP 110 is mounted to the load port 100 on the table 106, a lid 112 (shown in FIG. 3) of the FOUP 110 may be coupled to the door 108 such that when the door 108 is moved to an open position, the door 108 removes the lid from the FOUP 110 and the lid moves to the open position with the door 108. Similarly, when the door 108 is moved to a closed position, the lid of the FOUP 110 is moved with the door 108 and places the lid on the FOUP 110 to seal the FOUP 110. The purge shield 150 may be moved along with the door 108 (and lid), so that when the door 108 is moved to an open position, the purge shield 150 is placed in front of the opening 103. In some implementations, the purge shield 150 may be used as the door 108 to seal the opening 103, thereby obviating the need for a separate door 108.

Figure 3:
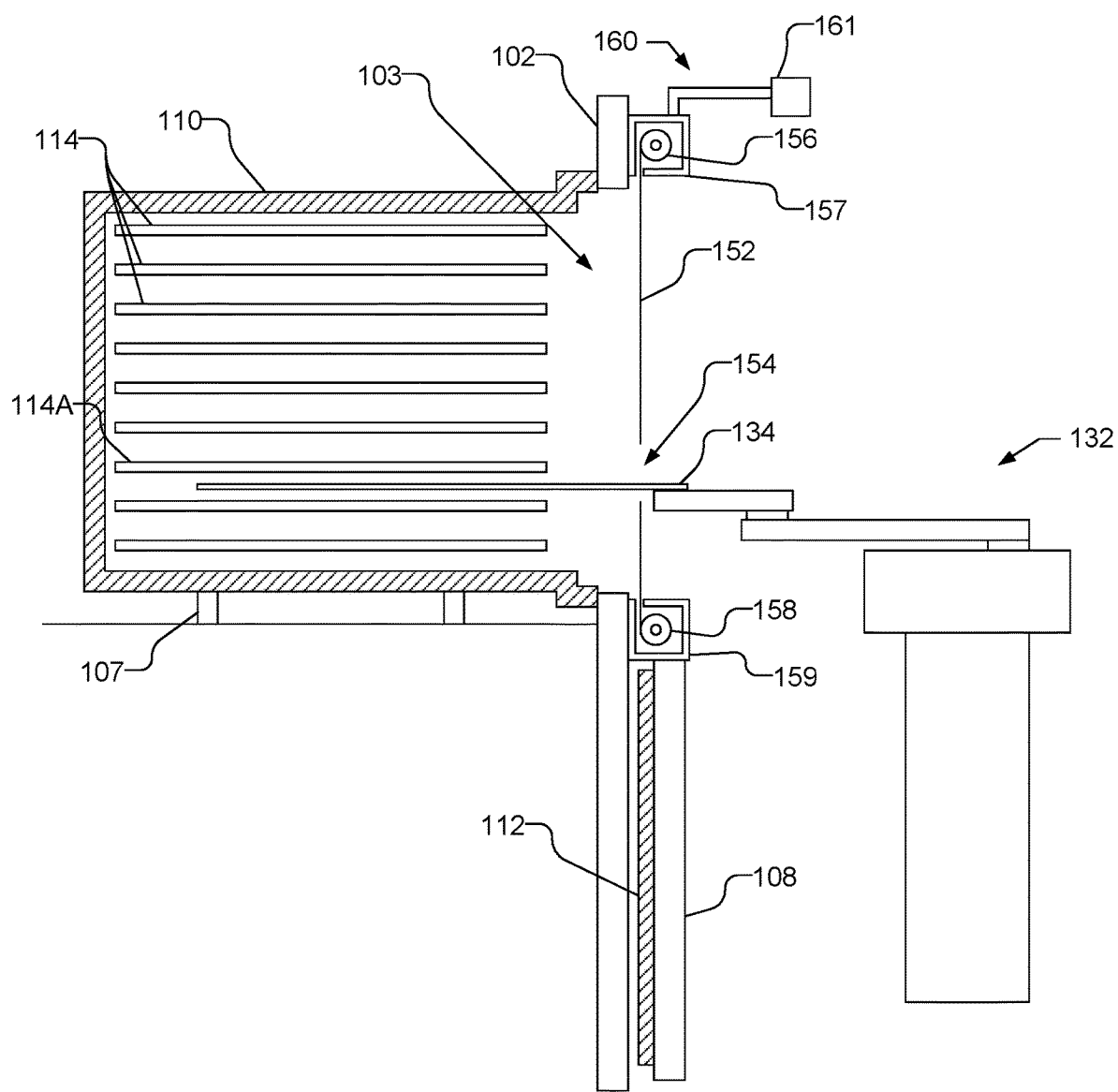
FIG. 3 illustrates a side view of the load port with the purge shield that uses a flexible shield member that extends between two rollers.

FIG. 3 illustrates a closer side view of the load port 100 with the purge shield 150. The shield member 152 may be flexible sheet that extends between a first roller 156 and a second roller 158. The one or both rollers 156 and 158 may be driven by a motor (not shown in FIG. 3) to move the wafer slot 154 vertically with respect to the FOUP 110. For example, the shield member 152 may be rolled onto the first roller 156 and simultaneously unrolled from the second roller 158 to move the shield member 152 upwards and may be unrolled from the first roller 156 and simultaneously rolled onto the second roller 158 to move the shield member 152 downwards, and thus, may be controlled to position the wafer slot 154 at a desired location so that the wafer transfer robot 132 can load or unload individual wafers 114 to or from the FOUP 110. If desired, the shield member 152 may be rolled onto either first roller 156 or second roller 158 so that the wafer slot 154 is rolled onto a roller, thereby completely sealing the opening 103. The shield member 152, for example, may be manufactured from material that is sufficiently thin to minimize stress from bending around the rollers for long lifetime, and also have minimal particle generation. By way of example, a stainless steel foil with a thin polymer coating may be used as the shield member.

As illustrated, the rollers 156 and 158 may be housed in enclosures 157 and 159, respectively, which may be coupled to the frame 102 or otherwise coupled to the load port 100. For example, one or more of the enclosures 157 and 159 may be movably connected to the frame 102, e.g., on rails, so that the enclosures 157 and 159 move downward or upward when the door 108 to the opening 103 (and the lid 112 to the FOUP 110) is opened or closed, respectively. By way of example, the enclosure 157 with upper roller 156 may be held stationary with respect to the frame 102, while the enclosure 159 with the lower roller 158 may be coupled to the door 108, so that the lower roller 158 unrolls the shield member 152 over the opening 103 when the door 108 is moved downward. One or both of the two rollers 156 and 158 may be controlled by motor drives, e.g., roller 156 (or 158) may be controlled by a motor, while the other roller 158 (or 156) may be tensioned with a spring return.

Figure 4:
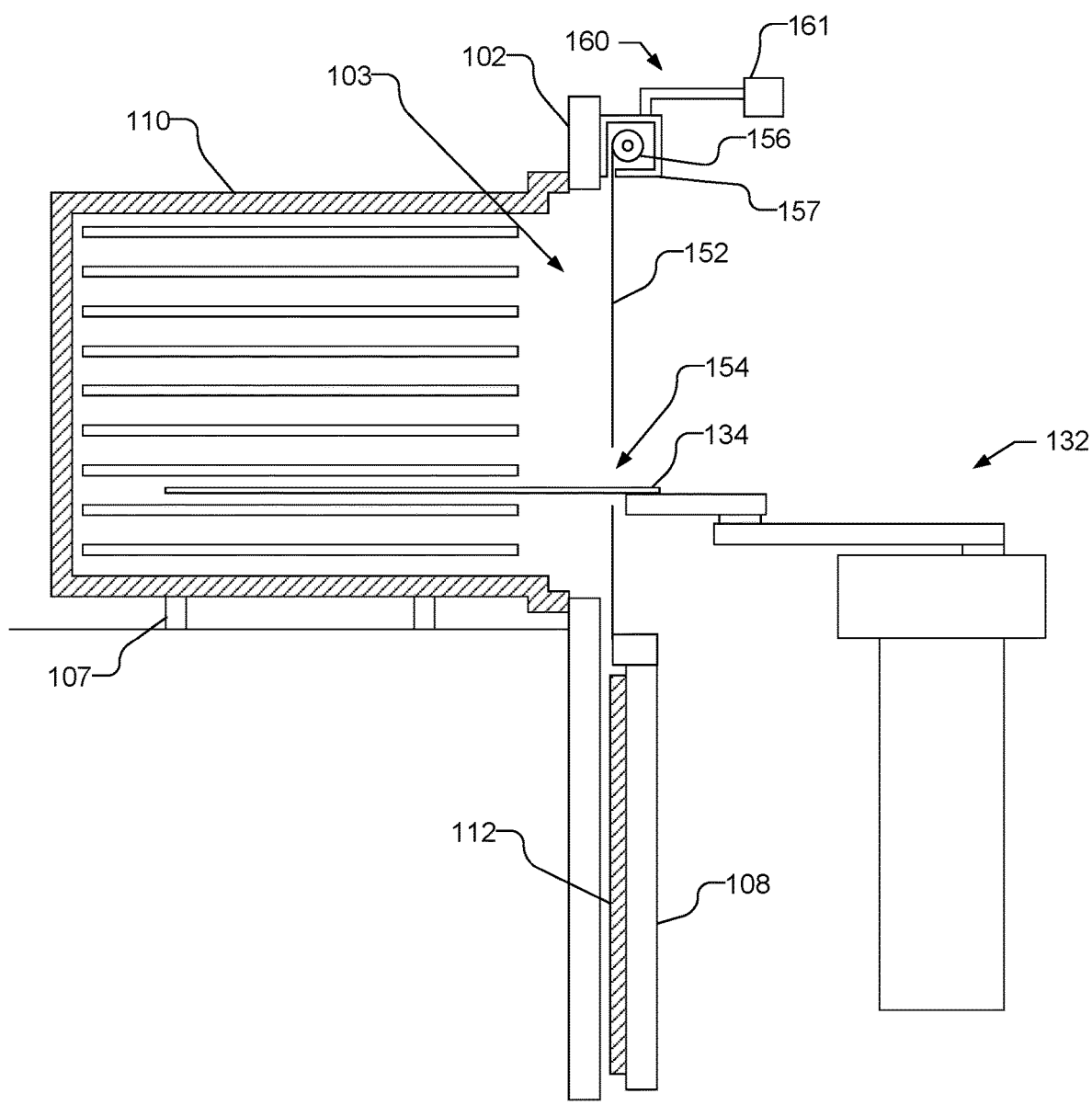
FIG. 4 illustrates a side view of another embodiment, similar to that shown in FIG. 3, but with the shield member coupled to the door without a second roller or enclosure.

FIG. 4 illustrates a side view of another embodiment, similar to that shown in FIG. 3, but with the shield member 152 coupled to the door 108 without a second (lower) roller 158 or enclosure 159. In the embodiment illustrated in FIG. 4, the upper roller 156 may be pretensioned with a spring or tensioned with a motor. With the shield member 152 fixed directly to the door 108, i.e., with no intervening roller, the position of the wafer slot 154 may be controlled by moving the door 108 up and down. The overall complexity of the system is thus reduced as the existing door drive mechanism is used to position the wafer slot 154.

As illustrated in FIGS. 3 and 4, an evacuation system 160 including at least one vacuum pump 161 may be fluidically coupled to the enclosure 157 and may be similarly coupled to enclosure 159 in FIG. 3, to evacuate air or gas accessing the enclosures 157 and 159 to reduce or prevents degradation of the purge environment within the FOUP 110 caused by air flow through the enclosures 157 and 159. Evacuation system 160 is illustrated in FIG. 3 as only being coupled to one enclosure (enclosure 157) for the sake of simplicity and to reduce clutter so as to not obscure other components of the load port 100, but it should be understood that evacuation system 160 with the same vacuum pump 161 or a different vacuum pump may be fluidically coupled to enclosure 159.

As can be seen in FIGS. 3 and 4, the shield member 152 covers the opening 103 thereby reducing or preventing degradation of the purge gas within the FOUP 110, while still providing access to wafer positions within the FOUP 110 for loading and unloading. The wafer slot 154 may be positioned at any desired vertical height and the end-effector 134 of the wafer transfer robot 132 may pass through the wafer slot 154. The end-effector 134, for example, may grab wafer 114A within the FOUP 110 and remove the wafer through the wafer slot 154. Similarly, the end-effector 134 may hold a wafer and load the wafer into the FOUP 110 through the wafer slot 154.

While some purge gas or air within the FOUP 110 may be permitted to escape through the wafer slot 154, the area of the wafer slot 154 is much reduced compared to the size of the entire opening 103, and accordingly, the amount of purge gas or air that may escape through the wafer slot 154 is much reduced compared to a conventional system, such as that shown in FIG. 1. Moreover, if desired, at least one purge port 107 in the load port 100 may be fluidically coupled to the FOUP 110 when the FOUP 110 is mounted on the table 106 and may provide purge gas or air into the FOUP 110 at a rate sufficient to replace purge gas or air that escapes through the wafer slot 154, thereby maintaining a clean environment for the wafers within the FOUP 110 while minimizing the amount of replacement purge gas or air, thereby reducing costs and potential hazards to service personnel.

Figure 5:
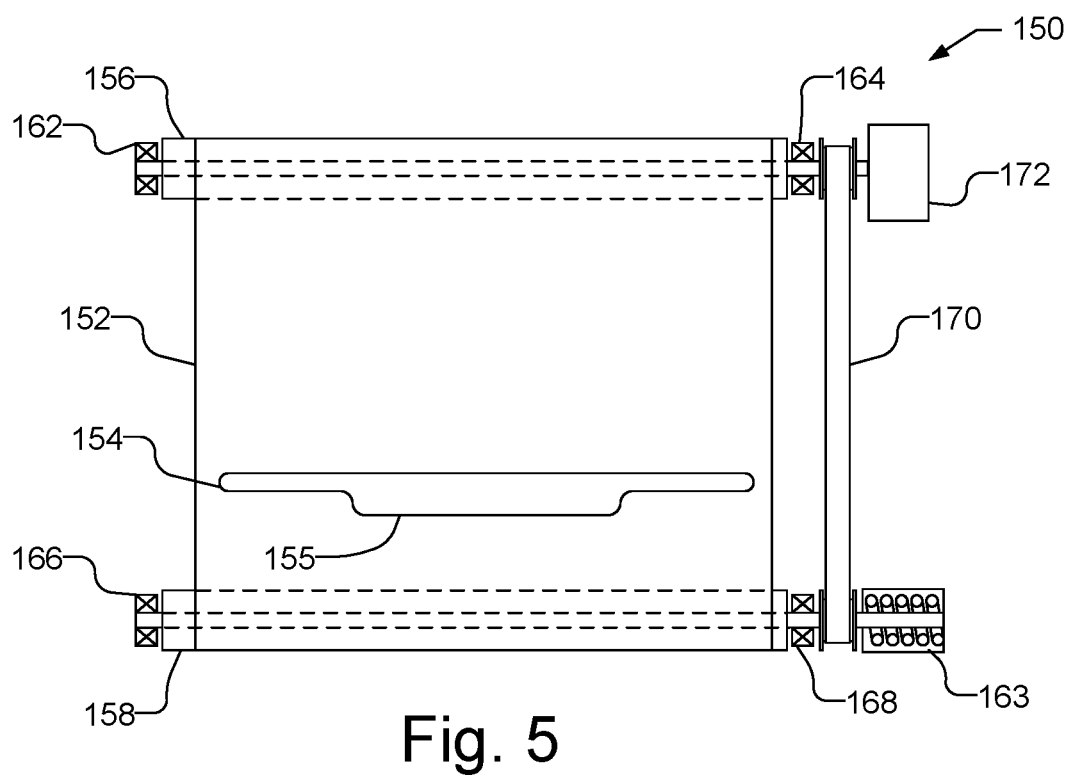
FIG. 5 illustrates a front view of a flexible shield member that is rolled on two rollers.

FIG. 5 illustrates a front view of the purge shield 150 with a flexible shield member 152 extending between rollers 156 and 158, without the presence of enclosures 157 and 159. As can be seen in the front view of the purge shield, the wafer slot 154 may have a rectangular shape (the corners may or may not be right angles, and may include a cut-out portion 155 that is sized to allow the end-effector 134 of the wafer transfer robot 132 to pass through when the wafer is loaded to or unloaded from the FOUP. The rollers 156 and 158 may be supported by bearings 162, 164, 166, and 168. Further, a motor 172 may be coupled to one roller, e.g., roller 156, to cause the roller 156 to rotate in a desired direction. The rollers 156 and 158 may be coupled together with a belt 170 so that motor 172 may cause roller 156 to rotate in the desired direction when the motor rotates roller 158. Additionally or alternatively, the non-motor drive roller, e.g., roller 158 in FIG. 5, may be coupled to a pretensioned spring return 163 to hold the shield member 152 taut between the rollers 156 and 158 when the wafer slot 154 is positioned at any desired vertical height.

Figure 6:
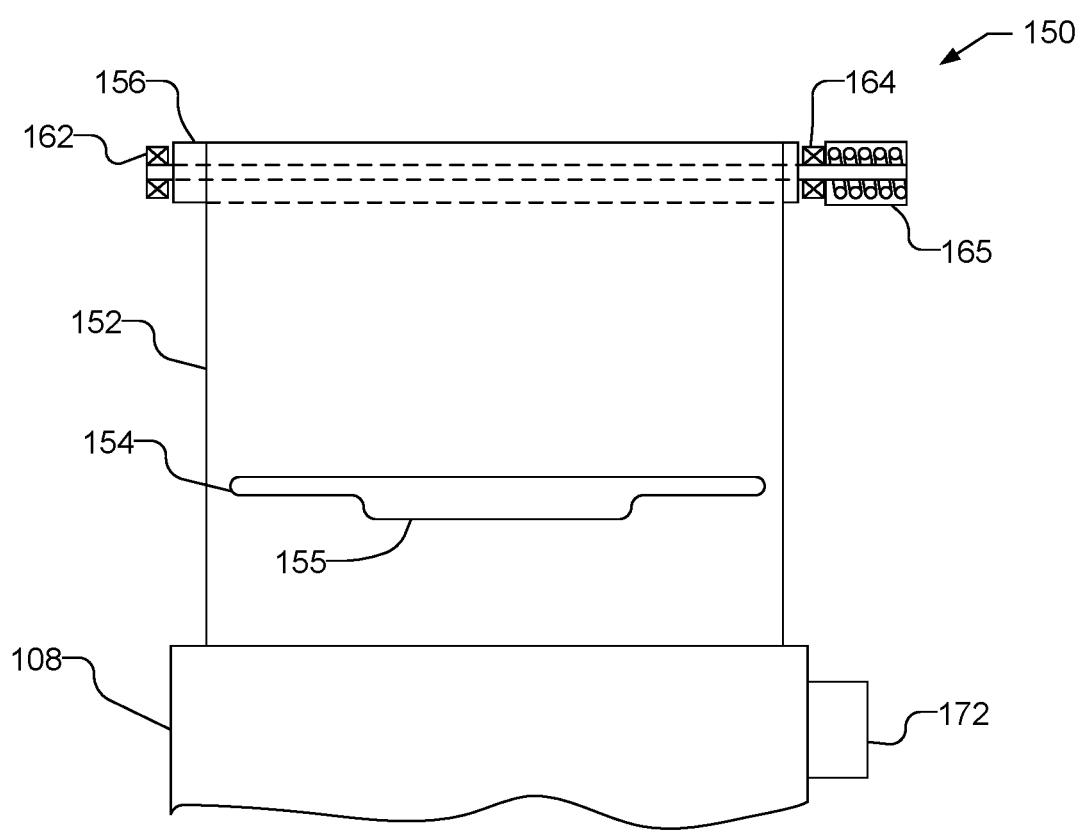
FIG. 6 illustrates a front view of a flexible shield member extending between a roller and the door of the load port.

FIG. 6 illustrates a front view of another embodiment of the purge shield 150 with a flexible shield member 152, similar to that shown in FIG. 5, like designated elements being the same. FIG. 6, however, illustrates the shield member 152 extending between roller 156 and the door 108 of the load port 100. The roller 156 is supported by bearings 162 and 164 and is pretensioned by spring return 165 so that the shield member 152 is held taut between the door 108 and the roller 156 regardless of the position of the door 108. The door 108 may be moved upward and downward by the door elevating motor 109 to position the wafer slot 154 at any desired vertical height.

Figure 7:
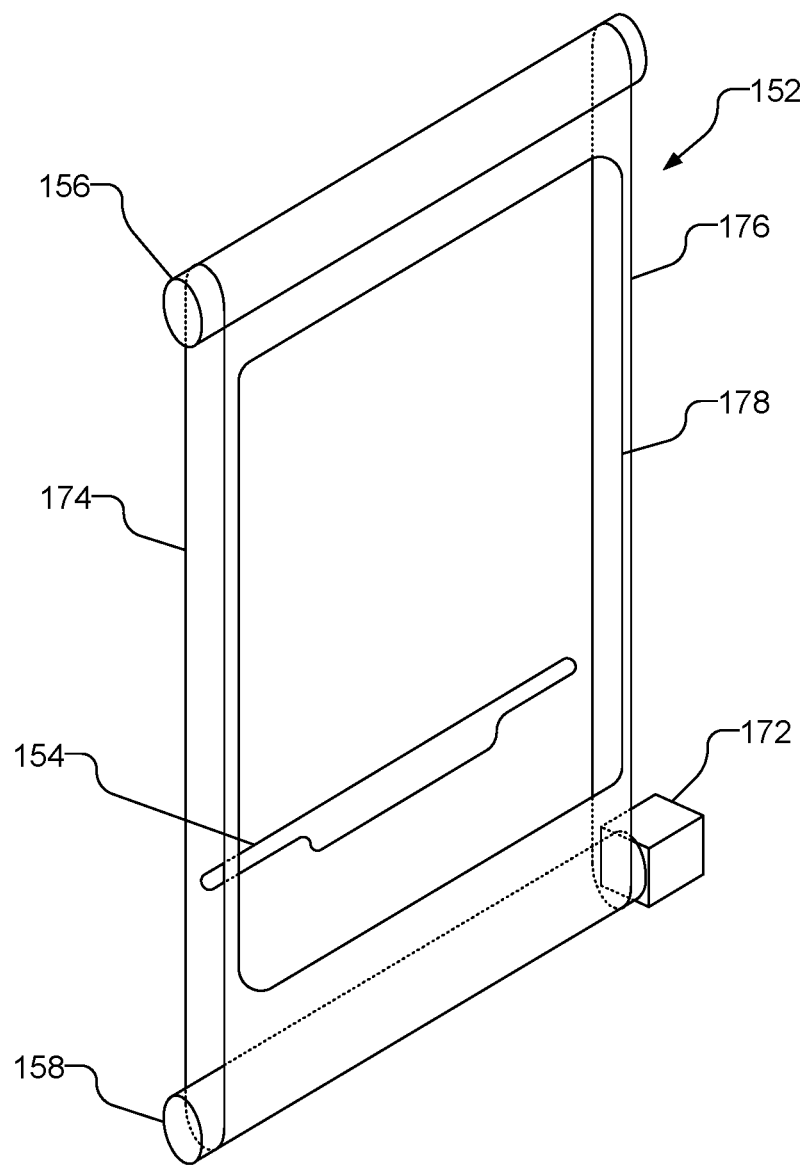
FIG. 7 illustrates a perspective view of a flexible shield member that is a continuous loop around two rollers.

FIG. 7 illustrates a perspective view of another implementation of the shield member 152 extending between rollers 156 and 158. As illustrated, the shield member 152 may be formed from a flexible sheet that is in a continuous loop around the rollers 156 and 158, which may be advantageous for retaining tension on the shield member 152 and obviating the need for a belt to drive the simultaneous rotation of both rollers 156 and 158, as shown in FIG. 5. The shield member 152 may have a first face 174 that includes the wafer slot 154, e.g., facing the FOUP 110, and a second face 176 having an elongated opening 178, which faces the environment, e.g., the wafer transfer chamber 130 shown in FIG. 2. The first face 174 and the second face 176 of the shield member 152 are on opposite sides of the rollers 156 and 158. For example, the first face 174 of the shield member 152 is on one side of the rollers 156 and 158 to provide a seal against the frame 102 or FOUP 110 to maintain the purge environment within the FOUP 110. The second face 176 with the elongated opening 178 is on the opposite side of the rollers 156 and 158 with the elongated opening 178 opposite the wafer slot 154 when the wafer slot 154 is positioned at any desired wafer position within the FOUP 110. The size and orientation of the elongated opening 178 allows wafers being loaded to and unloaded from the FOUP 110 to pass through the second face 176 regardless of the relative position of the wafer slot 154.

Figure 8:
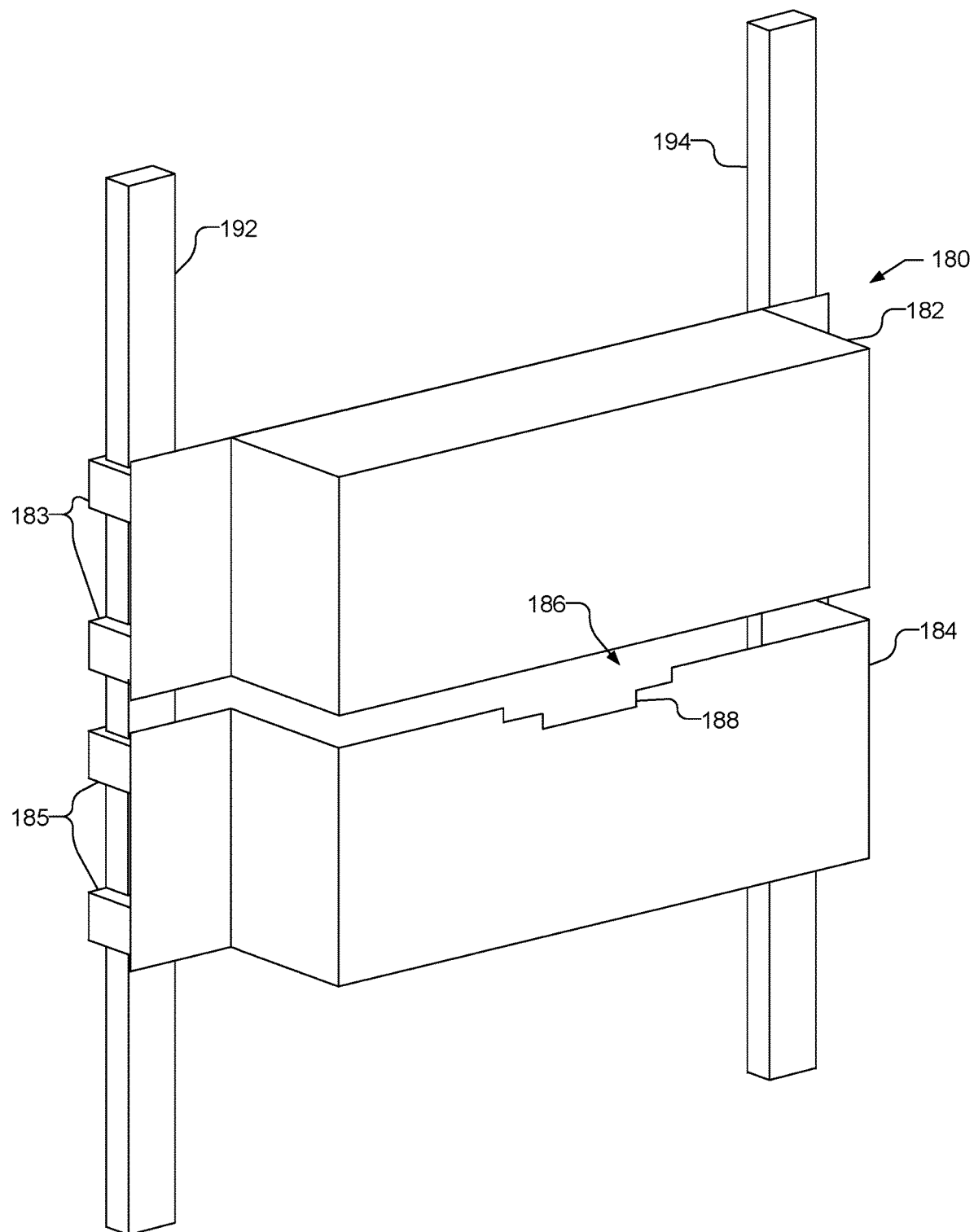
FIG. 8 illustrates a perspective view of a rigid shield member that slides on a pair of parallel rails.

FIG. 8 illustrates a perspective view of another implementation of a shield member 180 that may be used in place of the flexible shield member 152 and rollers 156 and 158, discussed above. The shield member 180 may be formed from at least one rigid member, and is illustrated in FIG. 8 as two separate rigid members 182 and 184. If desired, the rigid members 182 and 184 may be joined together or may be an upper and lower half from a single member. The rigid members 182 and 184, for example, may be fabricated from sheet metal, machined from plate or molded polymer. Rigid members 182 and 184 should be light enough to be actuated with a low power motor or pneumatic system capable of operating with position feedback for deterministic positioning with better than 1$mm$ accuracy. The rigid members 182 and 184 may be mounted on, e.g., linear bearings 183 and 185, respectively, that are slidably coupled to a pair of parallel rails 192 and 194, which may be part of or mounted on the frame 102, shown in FIG. 2. A separation between the rigid members 182 and 184 forms the wafer slot 186 through which wafers may be passed through to load to or unload wafers from the FOUP 110. As illustrated, a cut-out portion 188 may be formed in the bottom rigid member 184 to accommodate the end-effector 134 of the wafer transfer robot 132 when wafers are passed through the wafer slot 186. The rigid members 182 and 184 may move along the parallel rails 192 and 194 to move the wafer slot 186 vertically, upwards or downwards, to permit the wafer transfer robot 132 to access any desired wafer position within the FOUP 110. A drive mechanism, such as a direct drive linear motor, ballscrew or leadscrew, crankshaft, belt, or pneumatic cylinder may be used. Additionally, one or both of the rigid members 182 and 184 may be moved relative to the other to close the separation, i.e., the wafer slot 186 between the rigid members 182 and 184. For example, one or both of the rigid members 182 and 184 may be moved so that rigid member 184 overlaps with rigid member 182 thereby eliminating the separation between the rigid members 182 and 184. When overlapping, the rigid members 182 and 184 provide a seal over the FOUP 110 to prevent loss of the purge environment. One or both of the rigid members 182 and 184 may be moved slightly with respect the other to provide the separation between the rigid members 182 and 184 (as illustrated in FIG. 8) to provide the wafer transfer robot 132 access to a wafer position within the FOUP 110, e.g., to load or unload a wafer, during which a small amount of purge gas may be lost through the gap. Thus, the rigid members 182 and 184 should be fabricated accurately to nest closely without rubbing, but with a close enough fit to meet the required purge cleanliness at the flow rate suitable for the system. The rigid members 182 and 184 may be moved in unison (either when overlapping to close the separation or when separated to provide wafer slot 186) while being positioning to provide access another wafer position within the FOUP 110.

Figure 9:
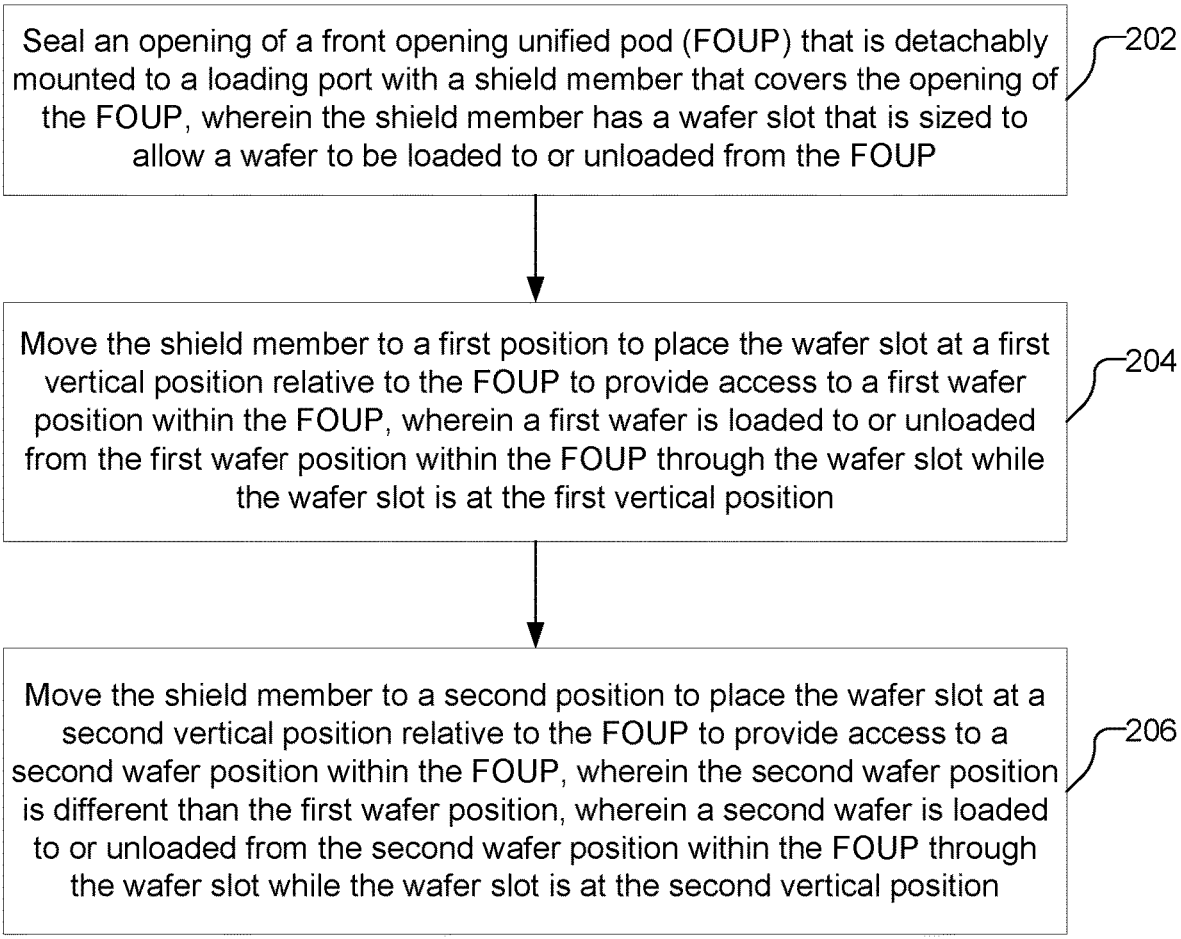
FIG. 9 is a flow chart illustrating a method of loading or unloading wafers from a FOUP with a load port having a purge shield.

FIG. 9 is a flow chart illustrating a method of loading or unloading wafers from a FOUP 110 with a load port 100 having a purge shield 150. As illustrated, the process includes sealing an opening of a FOUP that is detachably mounted to a loading port with a shield member, such as shield member 152 or shield member 180 that covers the opening of the FOUP, wherein the shield member has a wafer slot that is sized to allow a wafer to be loaded to or unloaded from the FOUP (202). The shield member is moved to a first position to place the wafer slot at a first vertical position relative to the FOUP to provide access to a first wafer position within the FOUP, wherein a first wafer is loaded to or unloaded from the first wafer position within the FOUP through the wafer slot while the wafer slot is at the first vertical position (204). The shield member is moved to a second position to place the wafer slot at a second vertical position relative to the FOUP to provide access to a second wafer position within the FOUP, wherein the second wafer position is different than the first wafer position, wherein a second wafer is loaded to or unloaded from the second wafer position within the FOUP through the wafer slot while the wafer slot is at the second vertical position (206). If desired, the shield member may be moved to additional positions relative to the FOUP to separately provide access to any or all wafer positions within the FOUP. If desired, the method may further include providing purge gas or air into the FOUP while the FOUP is detachably mounted to the loading port.

The shield member may be a flexible sheet, wherein moving the shield member to the first position and moving the shield member to the second position may comprise rolling the shield member onto or off of the at least one roller. For example, the at least one roller may include a first roller and a second roller where the shield member extends between the first roller and the second roller and rolling the shield member onto or off of the at least one roller comprises rotating the first roller and the second roller, e.g., with a motor rotating one or both of the first roller and the second roller. Rotating the first roller and second roller causes the shield member to roll onto the first roller and unroll from the second roller or causes the shield member to unroll from the first roller and roll onto the second roller to move the wafer slot vertically. In another implementations, the flexible sheet may form a continuous loop around the first roller and the second roller. The continuous loop of the flexible sheet may have a first side with the wafer slot and a second side having an elongated opening that is opposite the wafer slot when the wafer slot is positioned at any desired wafer position within the FOUP. In another implementation, the shield member may be coupled to, e.g., fixed to, a door of the load port, and the at least one roller may be one roller having a pretensioned assembly to rotate the roller to hold the shield member taut between the roller and the door. Rolling the shield member onto or off of at least one roller may include moving the door vertically to roll the shield member onto or off of the roller. Additionally, the method may include evacuating purge gas or air from an enclosure around each roller in the at least one roller.

The shield member may be at least one rigid member that is slidably coupled to a pair of parallel rails, wherein moving the shield member to the first position and moving the shield member to the second position may comprise sliding the at least one rigid member on the pair of parallel rails to move the wafer slot vertically. For example, the at least one rigid member may comprise a first rigid member and a second rigid member and the wafer slot may be formed by a separation between the first rigid member and the second rigid member. The method may further comprise moving at least one of the first rigid member and the second rigid member relative to the other to open and close the separation between the first rigid member and the second rigid member.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:
1. A load port for loading wafers to and unloading wafers from a front opening unified pod (FOUP), the load port comprising:
   a table upon which a FOUP is detachably mounted;
   a shield member that covers and provides a seal over an opening of the FOUP when the FOUP is mounted on the table, the shield member having a wafer slot that is sized to allow a wafer to be loaded to or unloaded from the FOUP, the shield member being movable to move the wafer slot vertically to provide access to any desired wafer position within the FOUP;
   a first roller and a second roller, wherein the shield member is a flexible sheet that extends between and is rolled onto the first roller and the second roller; and a motor that is coupled to the first roller to rotate at least the first roller to roll the shield member onto or off of the first roller and the second roller to move the wafer slot vertically;

wherein the flexible sheet forms a continuous loop around the first roller and the second roller, the continuous loop of the flexible sheet having a first side with the wafer slot and a second side having an elongated opening, the first side and the second side of the flexible sheet are on opposite sides of the first roller and the second roller and the elongated opening is opposite the wafer slot when the wafer slot is positioned at any desired wafer position within the FOUP.

2. The load port of claim 1, further comprising:

at least one of a belt rotatably coupled between the first roller and the second roller, wherein the belt causes the second roller to rotate when the motor rotates the first roller or a spring return coupled to the second roller to provide tension on the shield member.

3. The load port of claim 1, wherein the shield member is movable to move the wafer slot vertically by the flexible sheet being simultaneously rolled onto the first roller and unrolled from the second roller and by being simultaneously unrolled from the first roller and rolled onto the second roller.

4. The load port of claim 1, wherein the wafer slot in the shield member has a rectangular shape and includes a cut-out portion that is sized to allow an end-effector of a wafer transfer robot to pass through the shield member with the wafer when the wafer is loaded to or unloaded from the FOUP.

5. The load port of claim 1, further comprising at least one purge port that is fluidically coupled to the FOUP when the FOUP is mounted on the table, the at least one purge port configured to provide purging gas or air into the FOUP.

6. A load port, for loading wafers to and unloading wafers from a front opening unified pod (FOUP), the load port comprising:

a table upon which a FOUP is detachably mounted;

a shield member that covers and provides a seal over an opening of the FOUP when the FOUP is mounted on the table, the shield member having a wafer slot that is sized to allow a wafer to be loaded to or unloaded from the FOUP, the shield member being movable to move the wafer slot vertically to provide access to any desired wafer position within the FOUP;

at least one roller, wherein the shield member is a flexible sheet that extends from and is rolled onto the at least one roller; and a motor that drives the at least one roller to rotate to roll the shield member onto or off of the at least one roller to move the wafer slot vertically;

wherein the shield member is coupled to a door of the load port, and wherein the at least one roller comprises one roller having a pretensioned assembly to rotate the roller to hold the shield member taut between the roller and the door, wherein the motor is coupled to the door and causes the door to move vertically thereby causing the shield member to roll onto or off of the roller to move the wafer slot vertically.

7. The load port of claim 6, wherein the pretensioned assembly comprises at least one of a pretensioned spring return or a second motor.

8. A load port for loading wafers to and unloading wafers from a front opening unified pod (FOUP), the load port comprising:

a table upon which a FOUP is detachably mounted;

a shield member that covers and provides a seal over an opening of the FOUP when the FOUP is mounted on the table, the shield member having a wafer slot that is sized to allow a wafer to be loaded to or unloaded from the FOUP, the shield member being movable to move the wafer slot vertically to provide access to any desired wafer position within the FOUP;

at least one roller, wherein the shield member is a flexible sheet that extends from and is rolled onto the at least one roller; and a motor that drives the at least one roller to rotate to roll the shield member onto or off of the at least one roller to move the wafer slot vertically;

an enclosure for each roller in the at least one roller and further comprising an evacuation system that is coupled to the enclosure for each roller to evacuate purge gas or air from the enclosure for each roller.

9. A load port, for loading wafers to and unloading wafers from a front opening unified pod (FOUP), the load port comprising:

a table upon which a FOUP is detachably mounted;

a shield member that covers and provides a seal over an opening of the FOUP when the FOUP is mounted on the table, the shield member having a wafer slot that is sized to allow a wafer to be loaded to or unloaded from the FOUP, the shield member being movable to move the wafer slot vertically to provide access to any desired wafer position within the FOUP, wherein the shield member is at least one rigid member;

a pair of parallel rails having a vertical orientation, wherein the at least one rigid member is slidably coupled to the pair of parallel rails to move the wafer slot vertically to provide access to any desired wafer position within the FOUP.

10. The load port of claim 9, wherein the at least one rigid member comprises a first rigid member and a second rigid member, wherein the wafer slot is formed by a separation between the first rigid member and the second rigid member.

11. The load port of claim 10, wherein at least one of the first rigid member and the second rigid member is movable relative to the other to close the separation between the first rigid member and the second rigid member.

12. A method of loading or unloading wafers from a front opening unified pod (FOUP), the method comprising:

sealing an opening of the FOUP that is detachably mounted to a load port with a shield member that covers the opening of the FOUP, wherein the shield member has a wafer slot that is sized to allow a wafer to be loaded to or unloaded from the FOUP;

moving the shield member to a first position to place the wafer slot at a first vertical position relative to the FOUP to provide access to a first wafer position within the FOUP, wherein a first wafer is loaded to or unloaded from the first wafer position within the FOUP through the wafer slot while the wafer slot is at the first vertical position;

moving the shield member to a second position to place the wafer slot at a second vertical position relative to the FOUP to provide access to a second wafer position within the FOUP, wherein the second wafer position is different than the first wafer position, wherein a second wafer is loaded to or unloaded from the second wafer position within the FOUP through the wafer slot while the wafer slot is at the second vertical position;

wherein the shield member is a flexible sheet, wherein moving the shield member to the first position and moving the shield member to the second position comprises rolling the shield member onto or off of at least one roller;

wherein the at least one roller comprises a first roller and a second roller and the shield member extends between the first roller and the second roller, wherein rolling the shield member onto or off of the at least one roller comprises rotating the first roller and the second roller;

wherein the flexible sheet forms a continuous loop around the first roller and the second roller, the continuous loop of the flexible sheet having a first side with the wafer slot and a second side having an elongated opening, the first side and the second side of the flexible sheet are on opposite sides of the first roller and the second roller and the elongated opening is opposite the wafer slot when the wafer slot is positioned at any desired wafer position within the FOUP.

13. The method of claim 12, wherein the shield member is movable to place the wafer slot at additional vertical position relative to the FOUP to provide access to any and all wafer positions within the FOUP.

14. The method of claim 12, wherein rotating the first roller and the second roller causes the shield member to roll onto the first roller and unroll from the second roller or causes the shield member to unroll from the first roller and roll onto the second roller to move the wafer slot vertically.

15. The method of claim 12, further comprising providing purge gas or air into the FOUP while the FOUP is detachably mounted to the load port.

16. A method of loading or unloading wafers from a front opening unified pod (FOUP), the method comprising:
   sealing an opening of the FOUP that is detachably mounted to a load port with a shield member that covers the opening of the FOUP, wherein the shield member has a wafer slot that is sized to allow a wafer to be loaded to or unloaded from the FOUP;
   moving the shield member to a first position to place the wafer slot at a first vertical position relative to the FOUP to provide access to a first wafer position within the FOUP, wherein a first wafer is loaded to or unloaded from the first wafer position within the FOUP through the wafer slot while the wafer slot is at the first vertical position;
   moving the shield member to a second position to place the wafer slot at a second vertical position relative to the FOUP to provide access to a second wafer position within the FOUP, wherein the second wafer position is different than the first wafer position, wherein a second wafer is loaded to or unloaded from the second wafer position within the FOUP through the wafer slot while the wafer slot is at the second vertical position;
   wherein the shield member is a flexible sheet, wherein moving the shield member to the first position and moving the shield member to the second position comprises rolling the shield member onto or off of at least one roller;
   wherein the at least one roller comprises a first roller and a second roller and the shield member extends between the first roller and the second roller, wherein rolling the shield member onto or off of the at least one roller comprises rotating the first roller and the second roller;
   wherein the shield member is coupled to a door of the load port, and wherein the at least one roller comprises one roller having a pretensioned assembly to rotate the roller to hold the shield member taut between the roller and the door, wherein rolling the shield member onto or off of the at least one roller comprises moving the door vertically to roll the shield member onto or off of the roller.

17. A method of loading or unloading wafers from a front opening unified pod (FOUP), the method comprising:
   sealing an opening of the FOUP that is detachably mounted to a load port with a shield member that covers the opening of the FOUP, wherein the shield member has a wafer slot that is sized to allow a wafer to be loaded to or unloaded from the FOUP;
   moving the shield member to a first position to place the wafer slot at a first vertical position relative to the FOUP to provide access to a first wafer position within the FOUP, wherein a first wafer is loaded to or unloaded from the first wafer position within the FOUP through the wafer slot while the wafer slot is at the first vertical position;
   moving the shield member to a second position to place the wafer slot at a second vertical position relative to the FOUP to provide access to a second wafer position within the FOUP, wherein the second wafer position is different than the first wafer position, wherein a second wafer is loaded to or unloaded from the second wafer position within the FOUP through the wafer slot while the wafer slot is at the second vertical position;
   wherein the shield member is a flexible sheet, wherein moving the shield member to the first position and moving the shield member to the second position comprises rolling the shield member onto or off of at least one roller; and
   evacuating purge gas or air from an enclosure around each roller in the at least one roller.

18. A method of loading or unloading wafers from a front opening unified pod (FOUP), the method comprising:
   sealing an opening of the FOUP that is detachably mounted to a load port with a shield member that covers the opening of the FOUP, wherein the shield member has a wafer slot that is sized to allow a wafer to be loaded to or unloaded from the FOUP;
   moving the shield member to a first position to place the wafer slot at a first vertical position relative to the FOUP to provide access to a first wafer position within the FOUP, wherein a first wafer is loaded to or unloaded from the first wafer position within the FOUP through the wafer slot while the wafer slot is at the first vertical position;
   moving the shield member to a second position to place the wafer slot at a second vertical position relative to the FOUP to provide access to a second wafer position within the FOUP, wherein the second wafer position is different than the first wafer position, wherein a second wafer is loaded to or unloaded from the second wafer position within the FOUP through the wafer slot while the wafer slot is at the second vertical position;
   wherein the shield member is at least one rigid member slidably coupled to a pair of parallel rails, wherein moving the shield member to the first position and moving the shield member to the second position comprises sliding the at least one rigid member on the pair of parallel rails to move the wafer slot vertically.

19. The method of claim 18, wherein the at least one rigid member comprises a first rigid member and a second rigid member, wherein the wafer slot is formed by a separation between the first rigid member and the second rigid member, the method further comprising:
   moving at least one of the first rigid member and the second rigid member relative to the other to open and close the separation between the first rigid member and the second rigid member to close the wafer slot.

* * * * *